(12) United States Patent
Paul et al.

(10) Patent No.: US 11,652,112 B2
(45) Date of Patent: May 16, 2023

(54) SLT INTEGRATED CIRCUIT CAPACITOR STRUCTURE AND METHODS

(71) Applicant: pSemi Corporation, San Diego, CA (US)

(72) Inventors: Abhijeet Paul, Poway, CA (US); Hiroshi Yamada, San Diego, CA (US); Alain Duvallet, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 44 days.

(21) Appl. No.: 17/486,571

(22) Filed: Sep. 27, 2021

(65) Prior Publication Data

US 2022/0085079 A1 Mar. 17, 2022

Related U.S. Application Data

(63) Continuation of application No. 16/737,776, filed on Jan. 8, 2020, now Pat. No. 11,133,338, which is a continuation of application No. 16/040,390, filed on Jul. 19, 2018, now Pat. No. 10,573,674.

(51) Int. Cl.
*H01L 27/13* (2006.01)
*H01L 21/84* (2006.01)
(Continued)

(52) U.S. Cl.
CPC ........ *H01L 27/13* (2013.01); *H01L 21/76251* (2013.01); *H01L 21/84* (2013.01); *H01L 28/60* (2013.01)

(58) Field of Classification Search
CPC .............................. H01L 27/13; H01L 21/84
See application file for complete search history.

(56) References Cited

U.S. PATENT DOCUMENTS 5,633,182 A 5/1997 Miyawaki et al.
6,365,465 B1 4/2002 Chan
(Continued)

FOREIGN PATENT DOCUMENTS

EP 1453093 9/2004
EP 2814053 12/2014
(Continued)

OTHER PUBLICATIONS

Tobergte, Nicholas, Notice of Allowance received from the USPTO dated Jun. 4, 2020 for U.S. Appl. No. 16/439,466, 28 pgs.
(Continued)

*Primary Examiner* — Thao P Le
(74) *Attorney, Agent, or Firm* — Jaquez Land Greenhaus & McFarland LLP; John Land, Esq.

(57) ABSTRACT

FET IC structures that enable formation of integrated capacitors in a "flipped" SOI IC structure made using a back-side access process, such as a "single layer transfer" (SLT) process, and which eliminate or mitigate unwanted parasitic couplings to a handle wafer. In some embodiments, a conductive interconnect layer may be patterned, pre-SLT, to form an isolated first capacitor plate. In other embodiments, pre-SLT, a conductive region of the active layer of an IC may be patterned to form an isolated first capacitor plate, with one or more interconnect layers being fabricated in position to form an electrical contact to the first capacitor plate. In either case, a post-SLT top-side layer of conductive material may be patterned to form a second capacitor plate. Couplings to the resulting capacitor structures include only external connections, only internal connections, or both internal and external connections.

22 Claims, 10 Drawing Sheets

(51) Int. Cl.
  *H01L 21/762* (2006.01)
  *H01L 49/02* (2006.01)

(56) References Cited

U.S. PATENT DOCUMENTS

| | | |
|---|---|---|
| 6,580,132 B1 | 6/2003 | Chan |
| 7,180,019 B1 | 2/2007 | Chiou |
| 8,546,913 B2 | 10/2013 | Wada et al. |
| 8,552,487 B2 | 10/2013 | Doris et al. |
| 8,883,605 B2 | 11/2014 | Chen et al. |
| 9,312,369 B2 | 4/2016 | Tschumakow et al. |
| 9,385,083 B1 | 7/2016 | Herrault |
| 9,530,798 B1 | 12/2016 | Chou et al. |
| 9,755,029 B1 | 9/2017 | Goktepeli |
| 9,780,210 B1 | 10/2017 | Goktepeli et al. |
| 9,837,412 B2 | 12/2017 | Tasbas et al. |
| 9,960,098 B2 | 5/2018 | Olson |
| 10,573,674 B2 | 2/2020 | Paul |
| 10,580,903 B2 | 3/2020 | Yamada et al. |
| 10,672,806 B2 | 6/2020 | Paul et al. |
| 10,777,636 B1* | 9/2020 | Paul .................. H01L 23/5223 |
| 11,133,338 B2 | 9/2021 | Paul et al. |
| 2005/0037582 A1 | 2/2005 | Dennard |
| 2005/0242884 A1 | 11/2005 | Anand |
| 2006/0006496 A1 | 1/2006 | Harris et al. |
| 2006/0012006 A1 | 1/2006 | Tung et al. |
| 2008/0020488 A1 | 1/2008 | Clevenger et al. |
| 2008/0079037 A1 | 4/2008 | Zhu et al. |
| 2008/0277778 A1 | 11/2008 | Furman et al. |
| 2009/0010056 A1 | 1/2009 | Kuo |
| 2010/0155932 A1 | 6/2010 | Gambino et al. |
| 2010/0244934 A1 | 9/2010 | Botula et al. |
| 2012/0146193 A1 | 6/2012 | Stuber et al. |
| 2012/0193752 A1 | 8/2012 | Purushothaman et al. |
| 2013/0037922 A1 | 2/2013 | Arriagada et al. |
| 2013/0178043 A1* | 7/2013 | Cheng .................. H01L 27/1087 257/E21.214 |
| 2013/0270678 A1 | 10/2013 | Rankin et al. |
| 2014/0084391 A1 | 3/2014 | Lenive et al. |
| 2014/0191322 A1 | 7/2014 | Botula et al. |
| 2014/0264468 A1 | 9/2014 | Cheng et al. |
| 2014/0342529 A1 | 11/2014 | Goktepeli et al. |
| 2015/0137201 A1 | 5/2015 | Lee |
| 2015/0221714 A1 | 8/2015 | Gu et al. |
| 2015/0255368 A1 | 9/2015 | Costa |
| 2016/0020269 A1 | 1/2016 | Yang et al. |
| 2016/0027665 A1 | 1/2016 | Li et al. |
| 2016/0141228 A1 | 5/2016 | Leobandung |
| 2016/0336344 A1 | 11/2016 | Mason et al. |
| 2016/0336990 A1 | 11/2016 | Petzold et al. |
| 2016/0379943 A1 | 12/2016 | Mason et al. |
| 2017/0018497 A1 | 1/2017 | Zhai et al. |
| 2017/0033135 A1 | 2/2017 | Whitefield et al. |
| 2017/0084531 A1 | 3/2017 | Gu et al. |
| 2017/0186643 A1 | 6/2017 | Stamper |
| 2017/0186672 A1* | 6/2017 | Yamada ............ H01L 27/14618 |
| 2017/0201291 A1 | 7/2017 | Gu et al. |
| 2017/0271200 A1 | 9/2017 | Costa |
| 2017/0373026 A1* | 12/2017 | Goktepeli ......... H01L 29/78633 |
| 2018/0025970 A1* | 1/2018 | Kao .................. H01L 27/0688 257/401 |
| 2018/0151487 A1* | 5/2018 | Venugopal ............ H01L 21/288 |
| 2018/0158405 A1 | 6/2018 | Agostinelli |
| 2019/0288006 A1 | 9/2019 | Paul et al. |
| 2019/0288119 A1* | 9/2019 | Yamada ............ H01L 29/66484 |
| 2020/0027898 A1 | 1/2020 | Paul et al. |
| 2020/0027907 A1 | 1/2020 | Paul et al. |
| 2020/0027908 A1 | 1/2020 | Paul et al. |
| 2020/0043946 A1 | 2/2020 | Paul et al. |
| 2020/0227447 A1 | 7/2020 | Paul et al. |
| 2021/0020736 A1 | 1/2021 | Paul et al. |
| 2021/0217776 A1 | 7/2021 | Paul et al. |
| 2022/0208260 A1* | 6/2022 | Chiang ............... H01L 27/124 |

FOREIGN PATENT DOCUMENTS

| | | |
|---|---|---|
| EP | 2996143 | 3/2016 |
| EP | 3203507 | 8/2017 |
| JP | 2017174846 | 9/2017 |
| WO | 2007120697 | 10/2007 |
| WO | 2011008893 | 1/2011 |
| WO | 2016183146 | 11/2016 |
| WO | 2017038403 | 3/2017 |
| WO | 2019178004 | 9/2019 |
| WO | 2020018471 | 1/2020 |
| WO | 2020018847 | 1/2020 |
| WO | 2020028281 | 2/2020 |

OTHER PUBLICATIONS

Wirner, Christoph, Written Opinion received from the EPO dated Jul. 14, 2020 for appln. No. PCT/US2019/043994, 9 pgs.
Wirner, Christoph, Written Opinion received from the EPO dated Jul. 14, 2020 for appln. No. PCT/US2019/041898, 8 pgs.
Leitenmeier, Dr., Exam Report received from the German Patent Office dated Jul. 13, 2021 for appln. No. 11-2019-003-640.8, 5 pgs.
Le, Thao P., Office Action received from the USPTO dated Dec. 24, 2020 for U.S. Appl. No. 16/737,776, 38 pgs.
Le, Thao P., Notice of Allowance received from the USPTO dated May 20, 2021 for U.S. Appl. No. 16/737,776, 12 pgs.
Abdelaziez, Yasser A., Office Action received from the USPTO dated Dec. 20, 2019 for U.S. Appl. No. 16/243,947, 8 pgs.
Le, Thao P., Office Action received from the USPTO dated Mar. 22, 2019 for U.S. Appl. No. 16/040,390, 11 pgs.
Le, Thao P., Notice of Allowance received from the USPTO dated Jun. 5, 2019 for U.S. Appl. No. 16/040,390, 7 pgs.
Le, Thao P., Notice of Allowance received from the USPTO dated Aug. 20, 2019 for U.S. Appl. No. 16/040,390, 14 pgs.
Le, Thao P., Notice of Allowance received from the USPTO dated Dec. 18, 2019 for U.S. Appl. No. 16/040,390, 17 pgs.
Yamada, et al., "Semiconductor-on-Insulator Transistor with Improved Breakdown Characteristics", patent application filed in the USPTO on Mar. 13, 2018, U.S. Appl. No. 15/920,321, 45 pgs.
Mazumder, Didarul A., Office Action received from the USPTO dated Feb. 11, 2019 for appln. No. 15/920,321, 20 pgs.
Englekirk, et al., "Managed Substrate Effects for Stabilized SOI FETS", U.S. Patent Application filed in the USPTO on May 19, 2017, U.S. Appl. No. 15/600,588, 62 pgs.
Celler, et al., "Frontiers of Silicon-on-Insulator", Journal of Applied Physics, vol. 93, No. 9, May 1, 2003, pp. 4955-4978 (25 pgs).
Paul, et al., "Thermal Extraction of Single Layer Transfer Integrated Circuits", application filed in the USPTO on Jul. 19, 2018, U.S. Appl. No. 16/040,295, 44 pgs.
Paul, et al., "High-Q Integrated Circuit Inductor Structure and Methods", application filed in the USPTO on Jul. 19, 2018, U.S. Appl. No. 16/040,411, 43 pgs.
Le, Thao P., Office Action received from the USPTO dated Apr. 4, 2019 for U.S. Appl. No. 16/040,411, 6 pgs.
Mazumder, Didarul A., Final Office Action received from the USPTO dated Jun. 5, 2019 for U.S. Appl. No. 15/920,321, 31 pgs.
Le, Thao P., Office Action received from the USPTO dated Jun. 14, 2019 for U.S. Appl. No. 16/040,411, 5 pgs.
Meierewert, Klaus, Invitation to Pay Additional Fees and, Where Applicable, Protest Fee received from the EPO dated Jun. 28, 2019 for appln. No. PCT/US2019/021698, 13 pgs.
Huynh, Andy, Office Action received from the USPTO dated Oct. 25, 2019 for U.S. Appl. No. 16/040,295, 41 pgs.
Le, Thao P., Office Action received from the USPTO dated Sep. 13, 2019 for U.S. Appl. No. 16/040,411, 14 pgs.
Mazumder, Didarul A., Office Action received from the USPTO dated Oct. 18, 2019 for U.S. Appl. No. 15/920,321, 20 pgs.
Wirner, Christoph, International Search Report and Written Opinion received from the EPO dated Oct. 22, 2019 for appln No. PCT/US2019/041898, 11 pgs.
Topol, A., et al. Enabling SOI-based Assembly Technology for Three-Dimensional (3D) Integrated Circuits (ICs), International Electron Devices Meeting, Dec. 5, 2005, 4 pgs.

(56) References Cited

OTHER PUBLICATIONS

Wirner, Christoph, International Search Report and Written Opinion received from the EPO dated Oct. 28, 2019 for appln No. PCT/US2019/042486, 14 pgs.
Hoffman, Niels, International Search Report and Written Opinion received from the EPO dated Oct. 8, 2019 for appln. No. PCT/US2019/021698, 18 pgs.
Wirner, Christoph, International Search Report and Written Opinion received from the EPO dated Oct. 31, 2019 for appln No. PCT/US2019/043994, 16 pgs.
Mazumder, Didarul A., Notice of Allowance received from the USPTO dated Nov. 20, 2019 for U.S. Appl. No. 15/920,321, 13 pgs.
PSEMI Corporation, Preliminary Amendment filed in the USPTO dated Oct. 29, 2018 for U.S. Appl. No. 16/040,390, 5 pgs.
PSEMI Corporation, Response filed in the USPTO dated Apr. 3, 2019 for U.S. Appl. No. 16/040,390, 9 pgs.
Huynh, Andy, Notice of Allowance received from the USPTO dated Apr. 3, 2020 for U.S. Appl. No. 16/040,295, 30 pgs.
Le, Thao P., Notice of Allowance received from the USPTO dated Jan. 31, 2020 for appln. No. 16/040,411, 23 pgs.
Abdelaziez, Yasser A., Office Action received from the USPTO dated Mar. 9, 2020 for U.S. Appl. No. 16/243,947, 27 pgs.
Mazumder, Didarul A., Advisory Action received from the USPTO dated Aug. 19, 2019 for U.S. Appl. No. 15/920,321, 3 pgs.
Huynh, Andy, Office Action received from the USPTO dated Sep. 9, 2019 for U.S. Appl. No. 16/040,295, 5 pgs.

\* cited by examiner

SLT INTEGRATED CIRCUIT CAPACITOR STRUCTURE AND METHODS

CROSS-REFERENCE TO RELATED APPLICATIONS

The present application is a continuation of, and claims priority to, co-pending and commonly assigned U.S. patent application Ser. No. 16/737,776, filed Jan. 8, 2020, entitled "SLT Integrated Circuit Capacitor Structure and Methods", to issue on Sep. 28, 2021 as U.S. Pat. No. 11,133,338, the contents of which is incorporated herein by reference. Application Ser. No. 16/737,776 is a continuation of, and claims priority to, co-pending and commonly assigned U.S. patent application Ser. No. 16/040,390, filed Jul. 19, 2018, entitled "SLT Integrated Circuit Capacitor Structure and Methods", now U.S. Pat. No. 10,573,674 issued Feb. 25, 2020, the contents of which is incorporated herein by reference.

The present application may be related to the following patents and patent applications, the contents of all of which are incorporated herein by reference:

U.S. patent application Ser. No. 15/920,321, filed Mar. 13, 2018, entitled "Semiconductor-on-Insulator Transistor with Improved Breakdown Characteristics", now U.S. Pat. No. 10,580,903 issued Mar. 3, 2020;

U.S. patent application Ser. No. 16/040,295, filed Jul. 19, 2018, entitled "Thermal Extraction of Single Layer Transfer Integrated Circuits", now U.S. Pat. No. 10,658,386 issued May 19, 2020; and U.S. patent application Ser. No. 16/040,411, filed Jul. 19, 2018, entitled "High-Q Integrated Circuit Inductor Structure and Methods", now U.S. Pat. No. 10,672,806 issued Jun. 2, 2020.

BACKGROUND

(1) Technical Field

This invention relates to electronic integrated circuits, and more particularly to electronic integrated circuits having transistors fabricated with semiconductor-on-insulator technology.

(2) Background

Virtually all modern electronic products—including laptop computers, mobile telephones, and electric cars—utilize complementary metal oxide semiconductor (CMOS) transistor integrated circuits (ICs), and in many cases CMOS ICs fabricated using a semiconductor-on-insulator process, such as silicon-on-insulator (SOI) or germanium-on-insulator. SOI transistors in which the electrical insulator is aluminum oxide (i.e., sapphire) are called silicon-on-sapphire or "SOS" devices. Another example of a semiconductor-on-insulator technology is "silicon-on-glass", and other examples are known to those of ordinary skill in the art.

Taking SOI as one example of semiconductor-on-insulator, SOI technology encompasses the use of a layered silicon-insulator-silicon substrate in place of conventional "bulk" silicon substrates in semiconductor manufacturing. More specifically, SOI transistors are generally fabricated on a layer of silicon dioxide, $SiO_2$ (often called a "buried oxide" or "BOX" layer) formed on a bulk silicon substrate. The BOX layer reduces certain parasitic effects typical of bulk silicon CMOS processes, thereby improving performance. SOI-based devices thus differ from conventional bulk silicon devices in that the silicon regions of the CMOS transistors are fabricated on an electrical insulator (typically silicon dioxide or aluminum oxide) rather than on a bulk silicon substrate.

As a specific example of a semiconductor-on-insulator process for fabricating ICs, FIG. 1 is a stylized cross-sectional view of a typical prior art SOI IC structure 100 for a single metal-oxide-semiconductor (MOS) field effect transistor (FET), or MOSFET. The SOI structure 100 includes a substrate 102, a buried-oxide (BOX) insulator layer 104, and an active layer 106 (note that the dimensions for the elements of the SOI IC structure 100 are not to scale; some dimensions have been exaggerated for clarity or emphasis). The substrate 102 is typically a semiconductor material such as silicon. The BOX layer 104 is a dielectric, and is often $SiO_2$ formed as a "top" surface 102T of the silicon substrate 102, such as by oxidation, layer transfer, or implantation. The active layer 106 may include some combination of implants and/or layers that include dopants, dielectrics, polysilicon, metal wiring, passivation, and other materials to form active and/or passive electronic components and/or mechanical structures. For example, in the illustrated embodiment, a FET (encircled by a dashed oval 108) is shown, with the FET 108 comprising a source S, a drain D, and a primary gate G atop an insulating gate oxide (GOX) layer 110. A body B is defined below the primary gate G, between the source S and the drain D. In operation, a "conduction channel" (for an enhancement mode FET) or an "inversion channel" (for a depletion mode FET) is generated within the body B between the source S and the drain D and proximate the GOX layer 110 (e.g., within about the top 100A of the body B). A body contact (not shown), which generally comprises a region with the same doping as the body B, may be resistively coupled to the body B through an extension of the semiconductor island typically extending in the width direction of the transistor (in FIG. 1, that would be in/out of the plane of the image) to provide a fourth terminal to the FET 108. As is known, the body contact is commonly coupled to a bias node such as a power supply, to circuit ground, or to the source S (although other connection nodes are possible). If an SOI transistor has a body contact, it is known as body-contacted transistor, otherwise it is known as a floating-body transistor.

If the source S and drain D are highly doped with N type material, the FET is an N-type FET, or NMOS device. Conversely, if the source S and drain D are highly doped with P type material, the FET is a P-type FET, or PMOS device. Thus, the source S and drain D doping type determines whether a FET is an N-type or a P-type. CMOS devices comprise N-type and P-type FETs co-fabricated on a single IC die, in known fashion. The gate G is typically formed from polysilicon.

The BOX layer 104, the active layer 106, and one or more FETs 108 may be collectively referred to as a "device region" 114 for convenience (noting that other structures or regions may intrude into the device region 114 in particular IC designs). A superstructure 112 of various elements, regions, and structures may be fabricated in known fashion on or above the device region 114 in order to implement particularly functionality. The superstructure 112 may include, for example, conductive interconnections from the FET 108 to other components (including other FETs) and/or external contacts, passivation layers and regions, and protective coatings. The conductive interconnections may be, for example, copper or other suitable metal or electrically conductive material. Other elements, regions, and structures may be included for particular circuit designs. The formation of various layers creates a physical coupling between adjacent layers, which may include bonds at the atomic or molecular level and/or merging of layers (e.g., by implantation of dopants or the like).

As should be appreciated by one of ordinary skill in the art, a single IC die may embody from one electronic component—such as FET 108—to millions of electronic components. Further, the various elements of the superstructure 112 may extend in three-dimensions and have quite complex shapes. In general, the details of the superstructure 112 will vary from IC design to IC design.

The BOX layer 104, while enabling many beneficial characteristics for SOI IC's, also introduces some problems, such as capacitive coupling to the substrate 102, a thermal barrier to heat flow, and a voltage breakdown path to the substrate 102. Capacitive coupling with the substrate 102 alone can cause numerous side effects compared to an ideal SOI transistor, such as increased leakage current, lower breakdown voltage, signal cross-coupling, and linearity degradation. However, the most serious capacitive coupling effect caused by the BOX layer 104 is often the "back-channel" effect.

Referring back to FIG. 1, the structure of a secondary parasitic back-channel FET (shown in a dashed square 120) is formed by the source S, the drain D, the BOX layer 104 (functioning as a gate insulator), and the substrate 102 (effectively functioning as a secondary gate). Accordingly, the secondary parasitic back-channel FET 120 is coupled in parallel with the primary FET 108. Notably, the voltages and charge accumulations in and around the secondary gate (i.e., the substrate 102) may vary and in general are not well controlled. As is widely known, the presence of the secondary parasitic back-channel FET 120 adjacent the FET 108 can place the bottom of the FET 108 in uncontrolled states, often in a subthreshold leakage regime, which in turn may create uncontrollable source-drain leakage currents.

It is possible to mitigate some of the side effects of the secondary parasitic back-channel FET 120. One known mitigating technique utilizes "single layer transfer", or SLT, as part of the IC fabrication process. The SLT process essentially flips or inverts an entire SOI transistor structure upside down onto a "handle wafer", with the original substrate (e.g., substrate 102 in FIG. 1) then being removed, thereby eliminating the substrate 102. For example, FIG. 2 is a stylized cross-sectional view of a typical prior art SOI IC structure 100 for a single FET, fabricated using an SLT process. Essentially, after most or all of the superstructure 112 of FIG. 1 is completed, a first passivation layer 202 (e.g., SiO$_2$) is generally applied on top of the superstructure 112, and then the original substrate 102 and the layers denoted as "X" in FIG. 1 are flipped over and attached or bonded in known fashion to a handle wafer 204, as shown in FIG. 2. The handle wafer 204 is typically silicon with a bonding layer of SiO$_2$ (e.g., thermally grown oxide) on the surface facing the first passivation layer 202. Thereafter, the original substrate 102 is removed (e.g., by mechanical and/or chemical means), thus exposing the BOX layer 104. A non-conductive second passivation layer 206, which may be a conventional interlayer dielectric (ILD) material, may be formed on the exposed BOX layer 104.

In the structure of FIG. 2, the device region 114 is inverted with respect to the device region in FIG. 1. Thus, the portions of the FET 108 formerly closest to the original substrate 102 are now found near the "new top" of the IC structure, farthest away from the handle wafer 204. Conversely, those portions of the FET 108 formerly farthest away from the original substrate 102 are now found in the interior of the IC structure, situated closest to the handle wafer 204. Consequently, the gate G (and thus connections to the gate) of the FET 108 is now oriented towards the handle wafer 204, and the BOX layer 104 in the structure of FIGS. 1A and 1B—previously adjacent to the original substrate 102—is now very close to the "new top" of the IC structure.

Although not exactly to scale, the BOX layer 104 in FIG. 1 exhibits relatively high capacitive coupling to the original substrate 102, causing the above-mentioned side effects. Referring to FIG. 2, while the BOX layer 104 is still present with the inverted IC structure, the "backside" of the FET 108 is now near the "new top" of the IC structure, but with no adjacent semiconductive "backside gate" material (i.e., the original substrate 102).

FIG. 3 is a stylized cross-sectional view of a SOI IC structure 300 for a single FET made using a back-side access process as taught in co-pending U.S. patent application Ser. No. 15/920,321, referenced above. In this example, the superstructure 112 is shown in greater detail, and includes conductive (e.g., metal) interconnect levels M1 (closest to the FET 108), M2, M3, M4, and M5 (also known as the "top metal"), which are separated in places by insulating and/or passivation layers or regions (generally indicated as "oxide", but other materials may be used). As is known in the art, the various layers of the superstructure 112 are generally sequentially formed, and more or fewer than five interconnect levels may be used. Interconnections between the interconnect layers may be made by one or more vertical conductive vias 310 or the like, in known fashion (not all of the vias 310 are labeled, to avoid clutter).

A contact 302 is made to the gate G of the FET 108, typically at the M1 level. In the illustrated example, the second passivation layer 206 has been patterned and covered in whole or in part by a top-side layer 304 of conductive material (commonly aluminum). The top-side layer 304 may be used, for example, to distribute high current power around an IC chip and for signal connections.

The thicker interconnect levels (e.g., M4 and M5) are generally lower in electrical resistance than the thinner interconnect levels (e.g., M1-M3), and are commonly used to convey power around an IC. Of note, in the illustrated example, the top layer interconnect level M5 is closer to the handle wafer 204 than is the M1 interconnect level. In contrast, in a conventional, non-SLT configuration, such as the type shown in FIG. 1, the M1 interconnect level is closer to the substrate 102 than is the M5 interconnect level.

As is taught in U.S. patent application Ser. No. 15/920, 321, the top-side layer 304 also may be used to mitigate or eliminate the problems caused by the secondary parasitic back-channel FET of conventional FET IC structures. More particularly, embodiments of that invention enable full control of the secondary parasitic back-channel FET of semiconductor-on-insulator IC primary FETs by fabricating such ICs using a process which allows access to the backside of the FET, such as an SLT process (collectively, a "back-side access process"). Thereafter, as shown in FIG. 3, a conductive aligned supplemental (CAS) gate structure 306 is fabricated as part of the fabrication of the top-side layer 304 (the illustrated CAS gate structure 306 is shown in dashed outline to indicate that it is an optional element for a particular FET). The CAS gate structure 306 is formed relative to the BOX layer 104 and juxtaposed to a primary FET 108 such that a control voltage applied to the CAS gate structure 306 can regulate the electrical characteristics of the regions of the primary FET 108 adjacent the BOX layer 104. Such a FET may also be referred to as a "CAS-gated FET".

As should be apparent, one IC may have a mixture of conventional FETs and CAS-gated FETs (including all of, or none of, either type).

While "flipped" SOI IC structures of the type shown in FIG. 3 (with or without CAS-gated FETs) have a number of advantages, one disadvantage is the difficulty of forming capacitors without inducing unwanted parasitic couplings to the handle wafer 204. Accordingly, with "flipped" SOI IC structures of the type shown in FIG. 3, capacitors often must be components external to an IC and connected through terminal pads or the like. Accordingly, there is a need for FET IC structures that enable formation of integrated capacitors in a "flipped" SOI IC structure made using a back-side access process, such as an SLT process, and which eliminate or mitigate unwanted parasitic couplings to the handle wafer 204. The present invention addresses this need and more.

SUMMARY

The present invention encompasses FET IC structures that enable formation of integrated capacitors in a "flipped" SOI IC structure made using a back-side access process, such as a "single layer transfer" (SLT) process, and which eliminate or mitigate unwanted parasitic couplings to a handle wafer.

Some embodiments take advantage of the realization that back-side (or a post-SLT "new top") access can be made to one or more interconnect layers formed close to the active layer of an IC to create integrated capacitor structures. For example, a conductive interconnect layer may be patterned, pre-SLT, to form an isolated first capacitor plate, and a post-SLT top-side layer of conductive material may be patterned to form a second capacitor plate that is essentially parallel to the first capacitor plate and sufficiently close to provide a useful amount of capacitive coupling. Various ways of coupling the resulting capacitor structure include only external connections, or only internal connections, or both internal and external connections.

Other embodiments take advantage of the realization that back-side access can be made to the active layer of an IC through one or more interconnect layers formed close to the active layer to create integrated capacitor structures. For example, pre-SLT, a conductive region of the active layer may be patterned to form an isolated first capacitor plate, with one or more interconnect layers being fabricated in position to form an electrical contact to the first capacitor plate. A post-SLT top-side layer of conductive material may be patterned to form a second capacitor plate that is essentially parallel to the first capacitor plate and sufficiently close to provide a useful amount of capacitive coupling. Various ways of coupling the resulting capacitor structure include only external connections, or only internal connections, or both internal and external connections.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

The present invention encompasses FET IC structures that enable formation of integrated capacitors in a "flipped" SOI IC structure made using a back-side access process, such as a "single layer transfer" (SLT) process, and which eliminate or mitigate unwanted parasitic couplings to a handle wafer.

IC Capacitors

Capacitors are widely used in alternating current electronic equipment, particularly in radio frequency (RF) equipment. In an IC, a capacitor may be formed by fabricating two conductive regions or elements (e.g., polysilicon, doped silicon, or metal) in spaced relationship. A common construction is to fabricate at least two parallel planes or layers (generally called "plates" regardless of specific geometry) of conductive material in substantially aligned and spaced-apart relationship, and couple at least a first terminal T1 to a first plate, and at least a second terminal T2 to a second plate. The plates are separated by a dielectric, such as silicon oxide ($SiO_2$). The plates are formed in close enough proximity so as to be sufficiently capacitively coupled to be useful in circuits, particularly RF circuits. As is known, other configurations may be used to form an IC capacitor.

Figure 1:
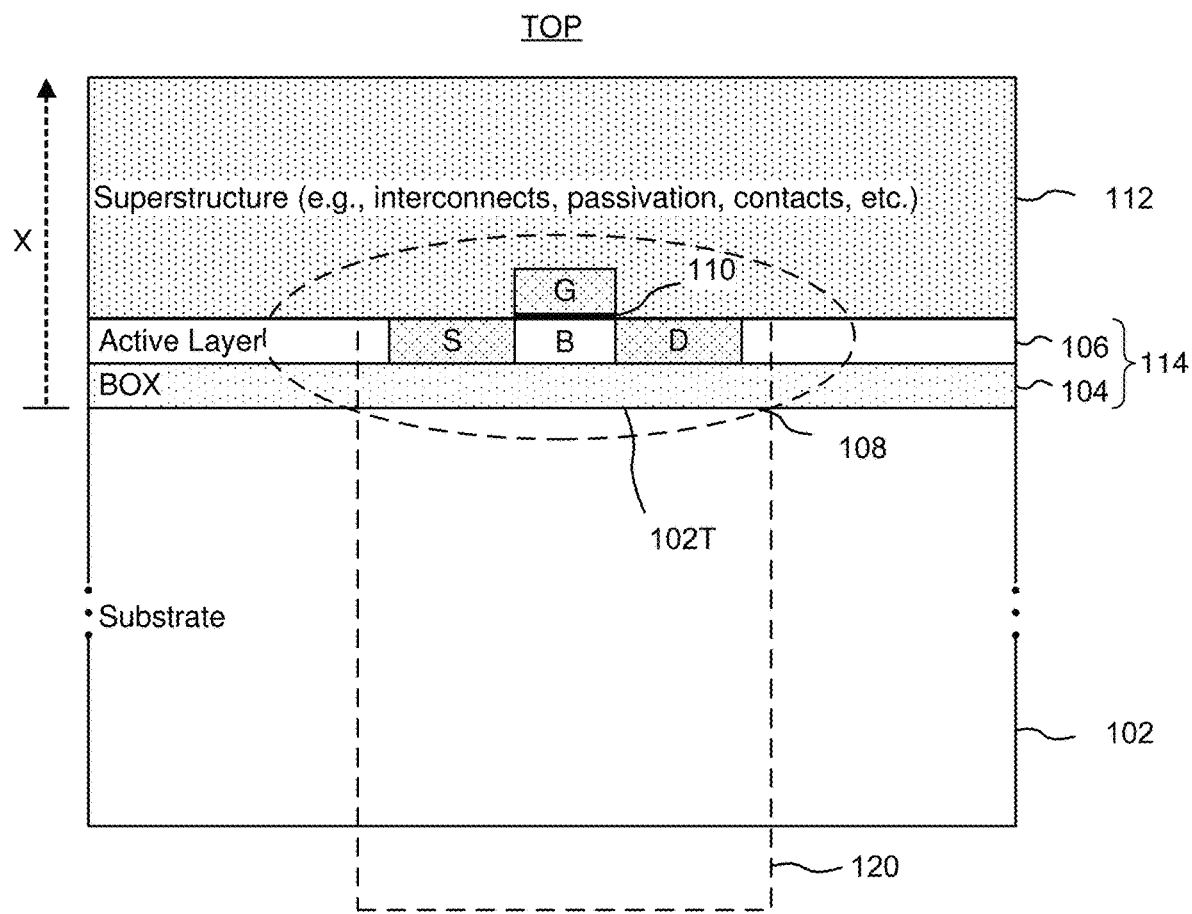
FIG. 1 is a stylized cross-sectional view of a typical prior art SOI IC structure for a single metal-oxide-semiconductor (MOS) field effect transistor (FET), or MOSFET.
Figure 2:
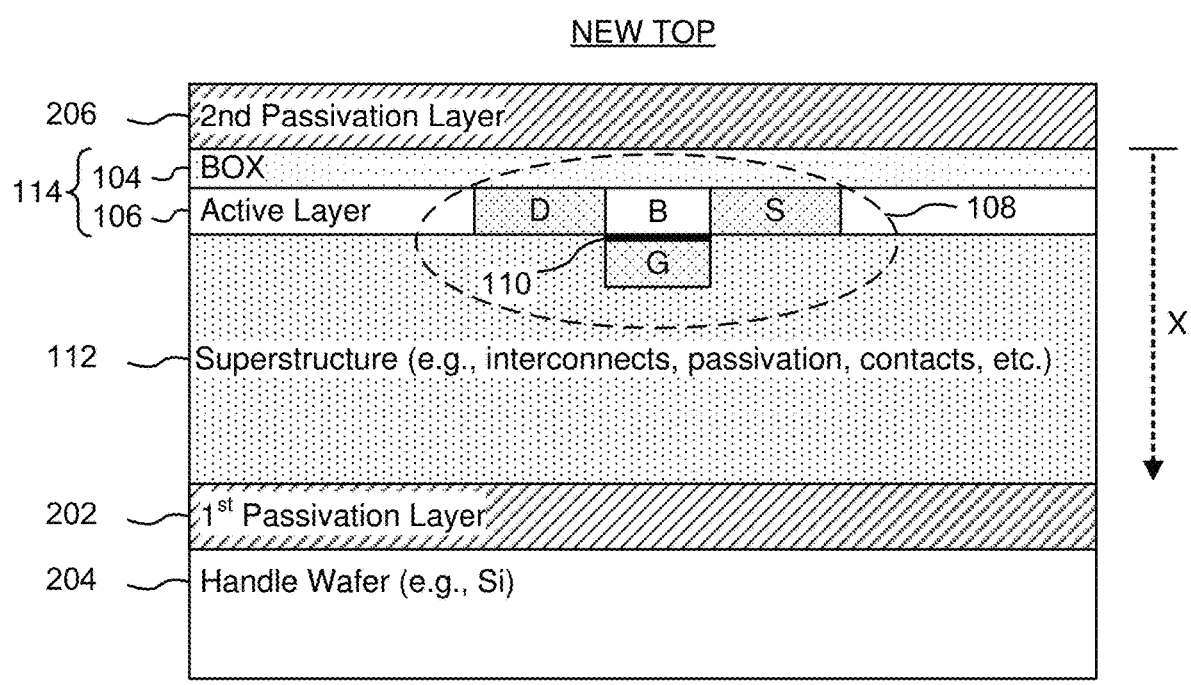
FIG. 2 is a stylized cross-sectional view of a typical prior art SOI IC structure for a single FET, fabricated using an SLT process.

In conventional ICs of the type shown in FIG. 1, capacitors are typically formed in interconnect levels (e.g., M5, M4) that are far away from the substrate 102, which is generally made of silicon, to mitigate capacitive coupling to the substrate 102, which would create unwanted parasitic capacitance. However, as should be apparent from FIG. 3, in a "flipped" or inverted SOI IC structure made using a back-side access process, such as an SLT process, those same interconnect levels (e.g., M5, M4) are in close proximity to the handle wafer 204. When the handle wafer 204 is made of silicon, such close proximity undesirably increases unwanted parasitic capacitive coupling between capacitors formed in the closest interconnect levels and the handle wafer 204.

While handle wafers made of non-conducting material (e.g., glass, quartz, diamond) would not exhibit capacitive coupling with capacitors formed in proximate interconnect levels, such handle wafers are currently quite expensive compared to conventional silicon wafers (currently, a factor of 10-12 difference). Further, some IC fabrication foundries are not set up to handle such less conventional materials. Accordingly, it is useful to use conventional silicon wafers for handle wafers, particularly inexpensive low resistivity silicon wafers.

First Example Integrated Capacitor Architecture

Figure 4A:
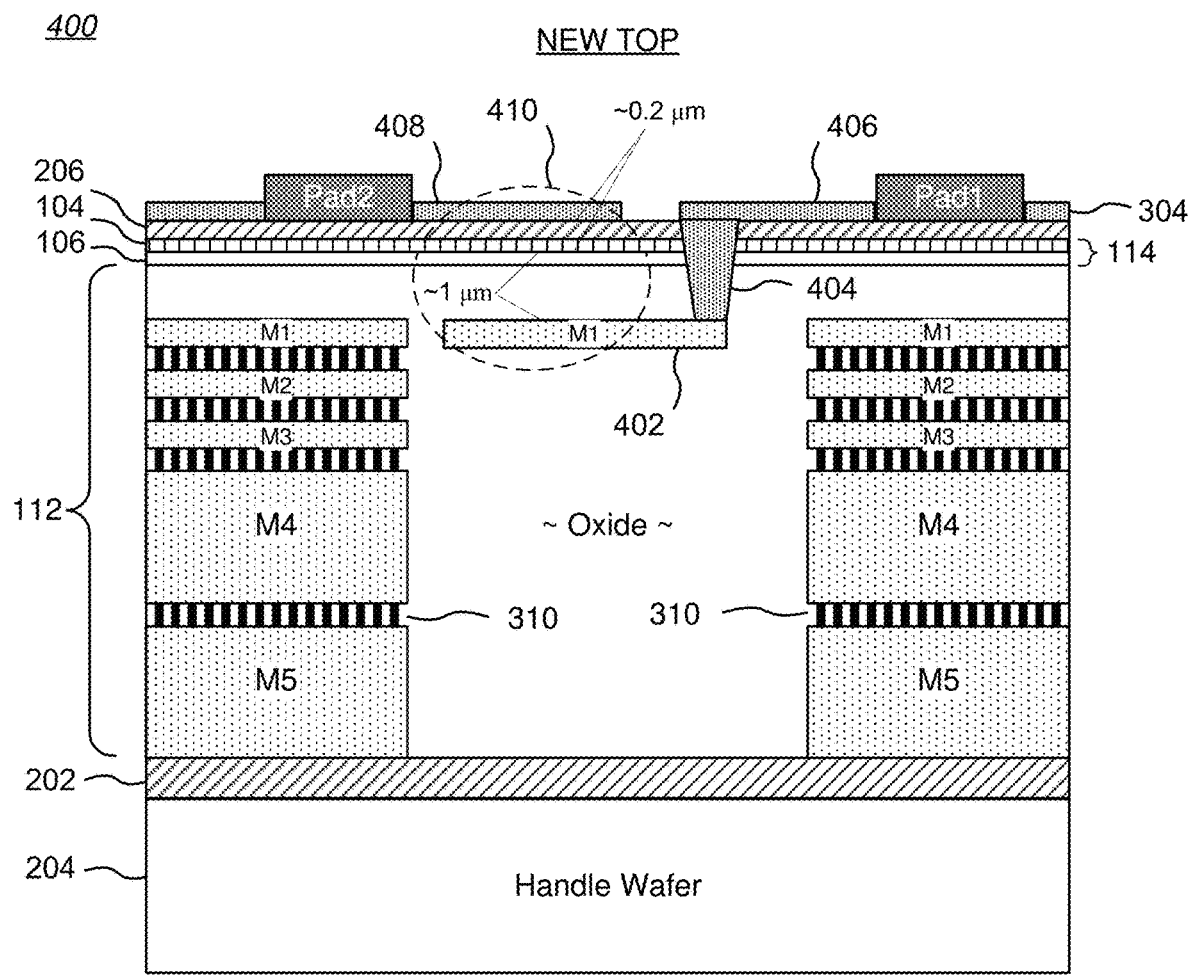
FIG. 4A is a stylized cross-sectional view of a SOI IC structure for a single FET made using a back-side access process and including a first integrated capacitor structure in accordance with the present invention.

FIG. 4A is a stylized cross-sectional view of a SOI IC structure 400 for a single FET made using a back-side access process and including a first integrated capacitor structure in accordance with the present invention. Essentially, the illustrated embodiment takes advantage of the realization that back-side (or "new top") access can be made to one or more interconnect layers formed close to the active layer 106 of an IC to create integrated capacitor structures.

Figure 3:
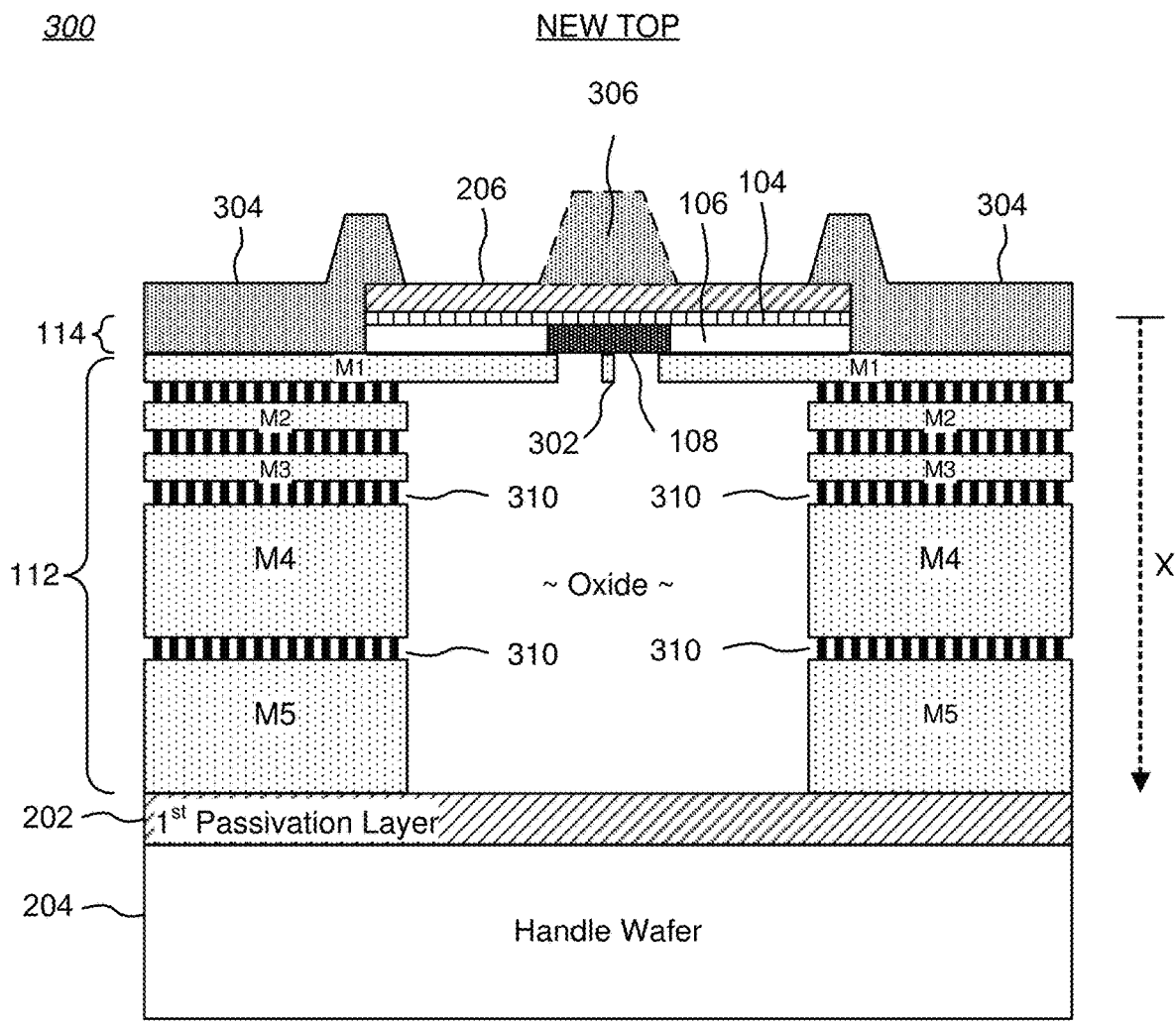
FIG. 3 is a stylized cross-sectional view of a SOI IC structure for a single FET made using a back-side access process as taught in co-pending U.S. patent application Ser. No. 15/920,321, referenced above.

The example IC structure shown in FIG. 4A is similar to the IC structure of FIG. 3. However, in the example illustrated in FIG. 4A, before wafer separation and bonding to the handle wafer 204 (e.g., pre-SLT), the M1 interconnect layer has been patterned using conventional techniques to form an isolated first capacitor plate 402 that is spaced apart from the active layer 106 by intervening dielectric material (e.g., oxide).

After applying a back-side access process, such as an SLT process, a via 404 of conductive material is formed through the second passivation layer 206, the BOX layer 104, and the active layer 106 to create an electrical contact to the first capacitor plate 402 (noting that the active layer 106 generally would be initially patterned to provide an isolated region in which the via 404 can be formed after wafer separation, so as to be electrically isolated from other components and regions within the active layer 106). For example, the via 404 may be made of copper and formed by masking and etching, in known fashion. A top-side layer 304 of conductive material (commonly aluminum) is applied and patterned to form an electrical connection 406 to the via 404.

The top-side layer 304 of conductive material is similarly patterned to form a second capacitor plate 408 that is spaced from the first capacitor plate 402 but sufficiently close to provide a useful amount of capacitive coupling. In the illustrated embodiment, the final capacitor structure is encircled by a dashed oval 410. The separation between the first capacitor plate 402 and the second capacitor plate 408 is about 1.2 μm in this example, with the BOX layer 104 itself providing about 0.2 μm of dielectric separation (noting that vertical dimensions in the figures are not to scale).

As should be appreciated, formation of the electrical connection 406 and of the second capacitor plate 408 is concurrent, simply by appropriately patterning the top-side layer 304, such as by masking and etching in known fashion.

It the example IC illustrated in FIG. 4A, the electrical connection 406 is electrically coupled to a conductive terminal pad, Pad1, and the second capacitor plate 408 is electrically coupled to a similar conductive terminal pad, Pad2. The terminal pads may be formed during the patterning of the top-side layer 304 and of the same conductive material (e.g., aluminum), but thicker to reduce resistance, or may be formed of another conductive material (e.g., gold) in a separate step.

Figure 4B:
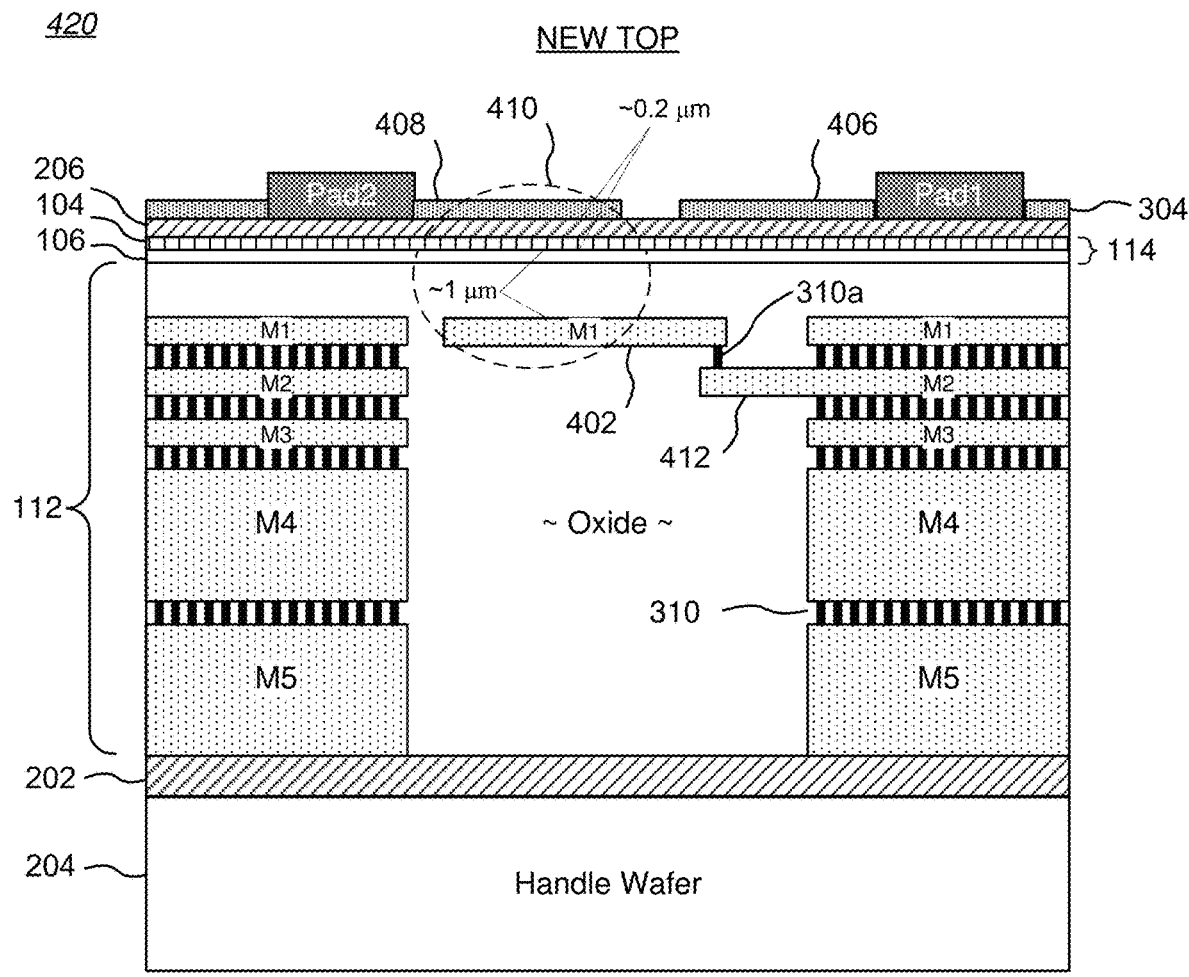
FIG. 4B is a stylized cross-sectional view of a SOI IC structure for a single FET made using a back-side access process and including a second integrated capacitor structure in accordance with the present invention.

FIG. 4B is a stylized cross-sectional view of a SOI IC structure 420 for a single FET made using a back-side access process and including a second integrated capacitor structure in accordance with the present invention. The example IC structure shown in FIG. 4B is similar to the IC structure of FIG. 4A, with the exception that the first capacitor plate 402 is not coupled to an external electrical connection 406, but rather is internally coupled to another interconnect layer (thus, Pad1 is not part of the capacitor circuit, but may be re-purposed for other uses). More specifically, in the illustrated example, the first capacitor plate 402 is coupled through a via 310*a* to a region 412 of the M2 interconnect layer. The resulting capacitor structure (encircled by the dashed oval 410) thus can be coupled between internal IC circuitry and external circuitry (e.g., an RF signal source). Such a capacitor structure may be used, for example, as a DC filtering capacitor.

Figure 4C:
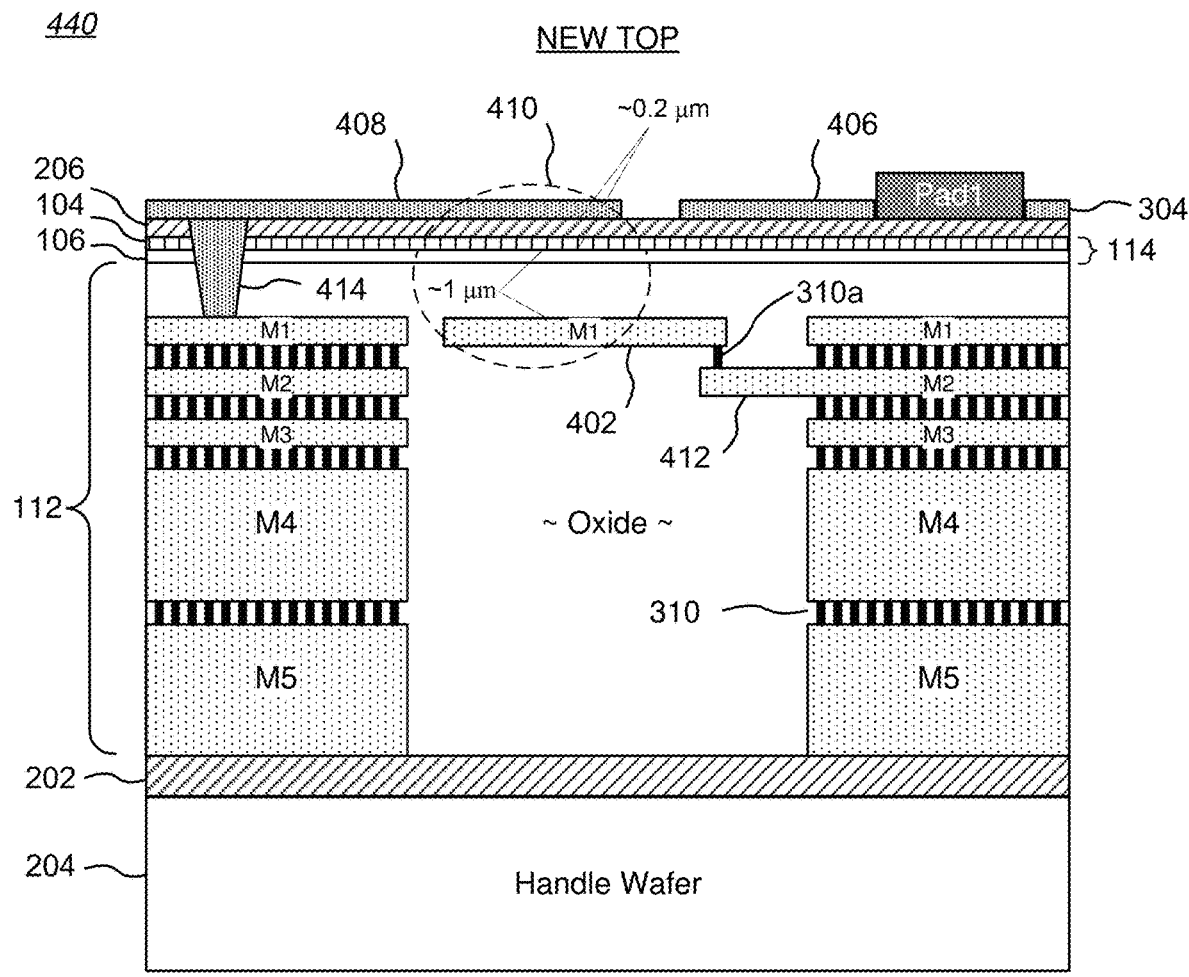
FIG. 4C is a stylized cross-sectional view of a SOI IC structure for a single FET made using a back-side access process and including a third integrated capacitor structure in accordance with the present invention.

FIG. 4C is a stylized cross-sectional view of a SOI IC structure 440 for a single FET made using a back-side access process and including a third integrated capacitor structure in accordance with the present invention. The example IC structure shown in FIG. 4C is similar to the IC structure of FIG. 4B, with the exception that the second capacitor plate 408 is not coupled to an external electrical connection (e.g., Pad2 in FIG. 4B), but rather is internally coupled to another interconnect layer (again, Pad1 is not part of the capacitor circuit, but may be re-purposed for other uses). More specifically, in the illustrated example, the second capacitor plate 408 is coupled through a via 414 to another region of the M1 interconnect layer. The resulting capacitor structure (encircled by the dashed oval 410) thus can be directly coupled solely between internal IC circuit elements.

Figure 4D:
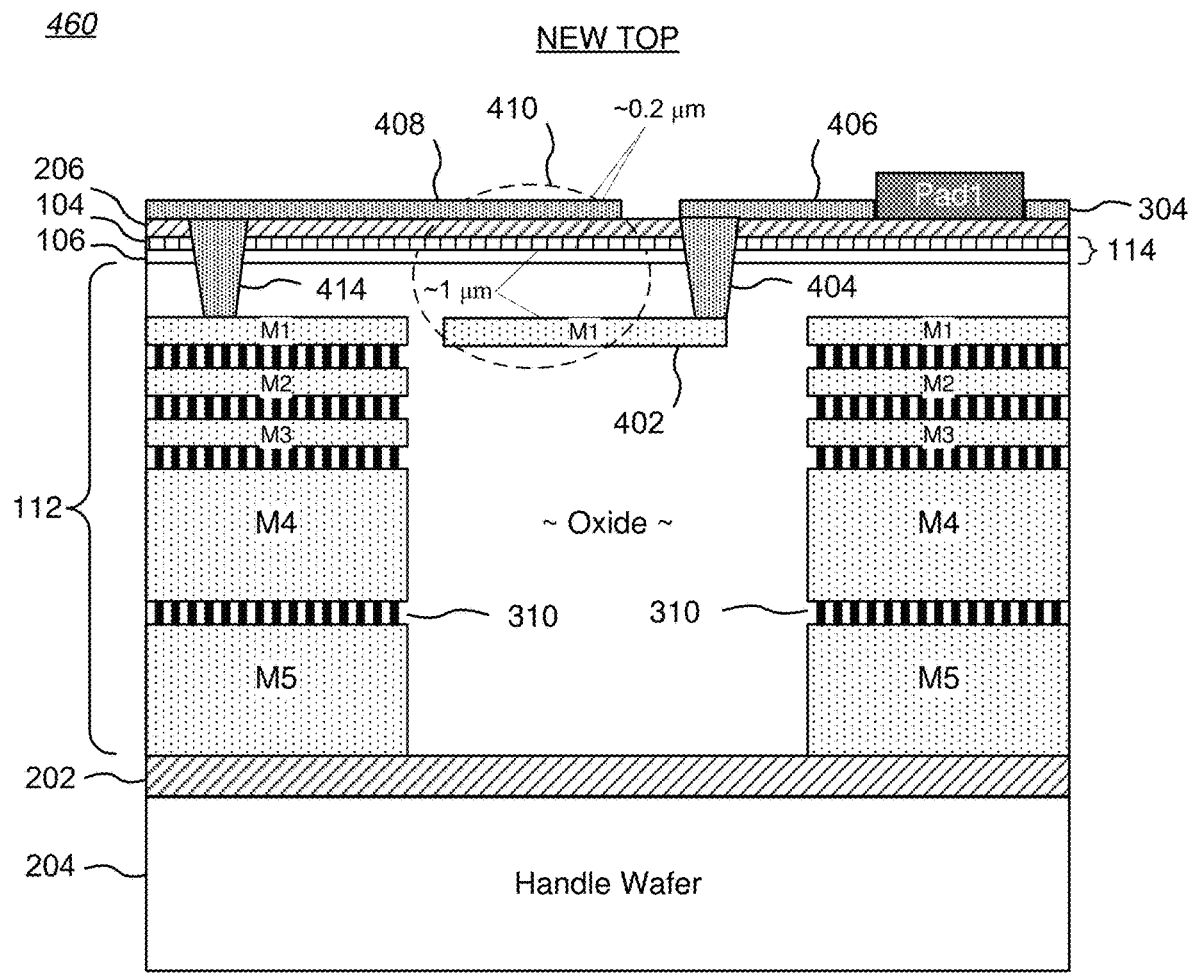
FIG. 4D is a stylized cross-sectional view of a SOI IC structure for a single FET made using a back-side access process and including a fourth integrated capacitor structure in accordance with the present invention.

FIG. 4D is a stylized cross-sectional view of a SOI IC structure 460 for a single FET made using a back-side access process and including a fourth integrated capacitor structure in accordance with the present invention. The example IC structure shown in FIG. 4D is similar to the IC structure of FIG. 4A (i.e., with the first capacitor plate 402 connected to Pad1), with the exception that the second capacitor plate 408 is not coupled to an external electrical connection (e.g., Pad2 in FIG. 4A), but rather is internally coupled to another interconnect layer. More specifically, in the illustrated example, the second capacitor plate 408 is coupled through a via 414 to another region of the M1 interconnect layer. The resulting capacitor structure (encircled by the dashed oval 410) thus can be coupled between internal IC circuitry and external circuitry (e.g., an RF signal source). Such a capacitor structure may be used, for example, as a DC filtering capacitor.

As should be appreciated, a particular IC may have multiple instances of any or all of the capacitor structures shown in FIGS. 4A-4D. Electrical connections to such capacitor structures can be made in a variety of ways, including the illustrated connection ways, and in any feasible combination of such ways. Thus, some capacitor structures may have only external connections, some capacitor structures may have only internal connections, and yet other capacitor structures may have both internal and external connections. Accordingly, capacitor structures in accordance with the present invention may be coupled to other components in an assortment of ways to accommodate the design and layout of a particular IC.

Second Example Integrated Capacitor Architecture

The IC structures shown in FIGS. 4A-4D show configurations in which the first capacitor plate 402 is an isolated portion of an interconnect layer, such as the M1 interconnect layer. However, an integrated capacitor structure in accordance with the present invention may be formed using an isolated portion of the active layer 106 as one capacitor plate. Essentially, such embodiments take advantage of the realization that back-side (or "new top") access can be made to the active layer of an IC through one or more interconnect layers formed close to the active layer 106 to create integrated capacitor structures.

An advantage of using an isolated portion of the active layer 106 as a capacitor plate is that the intervening BOX layer 104 and second passivation layer 206 are very thin and very uniform in thickness and quality, which allows fabrication of high quality capacitors. The BOX layer 104 and second passivation layer 206 are both generally of the same material, $SiO_2$, which has a dielectric strength of about $8 \times 10^6$ V/cm. In some fabrication processes, it is possible to make a very thin BOX layer 104 (e.g., about 50 nm) and second passivation layer 206 (e.g., about 100 nm). Thinner layers provide a better capacitive density. Another way to improve capacitive density is to form the second passivation layer 206 from a high dielectric constant material (such as silicon nitride or hafnium dioxide) on the BOX layer 104, preferably a thin BOX layer 104.

Figure 5:
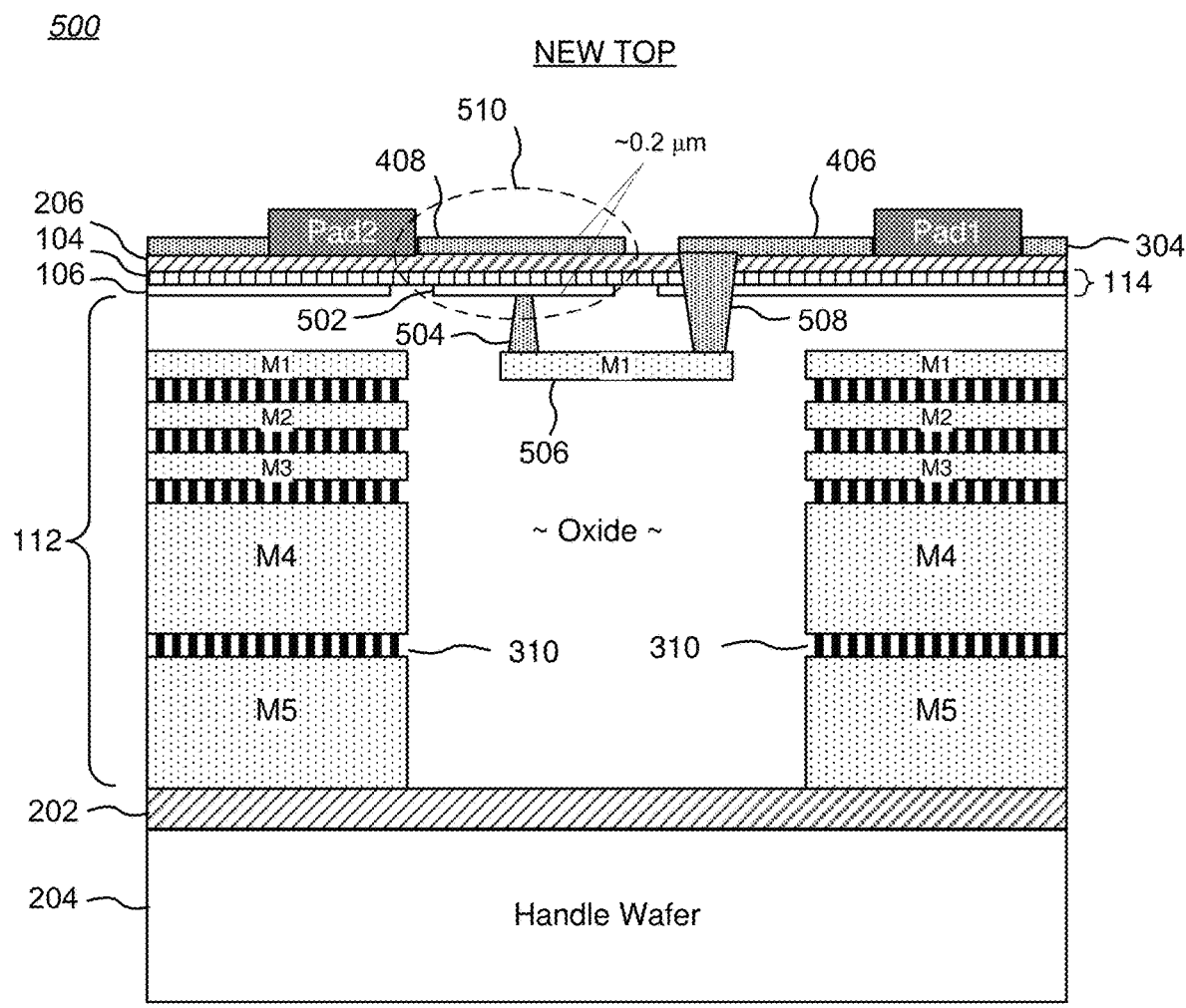
FIG. 5 is a stylized cross-sectional view of a SOI IC structure for a single FET made using a back-side access process and including a fifth integrated capacitor structure in accordance with the present invention.

As one example, FIG. 5 is a stylized cross-sectional view of a SOI IC structure 500 for a single FET made using a back-side access process and including a fifth integrated capacitor structure in accordance with the present invention. In the illustrated example, an isolated first capacitor plate 502 is formed by patterning the active layer 106, typically during the fabrication of any active components, such as FETs 108 of the type shown in FIG. 1. The isolated active layer 106 may be doped with suitable dopants or converted to silicide to achieve a desired level of conductivity. Thereafter, a first via 504 may be formed in conventional manner to provide an electrical connection to a selected portion of an interconnect layer, such as an isolated portion 506 of the M1 interconnect layer, which serves as a "buried" lateral connection.

Thereafter, the remainder of the superstructure 112 is formed, the second passivation layer 202 is applied, and a back-side access process, such as an SLT process, is applied to "flip" the IC structure and create a "new top" (i.e., the backside of the IC, shown with an applied second passivation layer 206).

With the backside of the IC being accessible, a second via 508 may be formed in electrical contact with the buried isolated portion 506 of the selected interconnect layer, such as in the manner described above with respect to FIG. 4A. A top-side layer 304 of conductive material is applied and patterned to form an electrical connection 406 to the via 508. Accordingly, the first capacitor plate 502 is coupled through the first via 504, the laterally-extending isolated portion 506 of the M1 interconnect layer, the second via 508, to the electrical connection 406; in this example, the electrical connection 406 is in turn coupled to Pad1.

The top-side layer 304 of conductive material is similarly patterned to form a second capacitor plate 408 that is spaced from the first capacitor plate 502 but sufficiently close to provide a useful amount of capacitive coupling. In the illustrated embodiment, the final capacitor structure is encircled by a dashed oval 510. As should be appreciated, formation of the electrical connection 406 and of the second capacitor plate 408 is concurrent, simply by appropriately patterning the top-side layer 304, such as by masking and etching in known fashion.

It the example IC illustrated in FIG. 5, the electrical connection 406 is electrically coupled to a conductive terminal pad, Pad1, and the second capacitor plate 408 is electrically coupled to a similar conductive terminal pad, Pad2. However, the alternative connection pathways shown in FIGS. 4B-4D may also be applied to an IC having one or more capacitor structures of the type shown in FIG. 5. Further, a particular IC may have multiple instances of any or all of the capacitor structures shown in FIGS. 4A-4D and FIG. 5. Electrical connections to such capacitor structures can be made in a variety of ways, including the illustrated connection ways, and in any feasible combination of such ways. Thus, some capacitor structures may have only external connections, some capacitor structures may have only internal connections, and yet other capacitor structures may have both internal and external connections. Accordingly, capacitor structures in accordance with the present invention may be coupled to other components in an assortment of ways to accommodate the design and layout of a particular IC.

The second passivation layer 206 and the BOX layer 104 provide about 0.2 μm of dielectric separation between the first capacitor plate 502 and the second capacitor plate 408 (again noting that vertical dimensions in the figures are not to scale). In comparison, for example ICs made using the same design rules, the dielectric separation of capacitive structures in accordance with the examples of FIGS. 4A-4D is about 1.2 μm, a factor of 6 difference. Accordingly, the capacitance per unit area of the capacitive structure of FIG. 5 is significantly greater than capacitance per unit area of the capacitive structures of FIGS. 4A-4D, which allows fabrication of smaller (less planar area) capacitors for a specified capacitance value using the capacitive structure of FIG. 5.

Benefits and Variations

The IC structures shown in FIGS. 4A-4D and FIG. 5 show integrated capacitor structures in which the first capacitor plate 402 is an isolated portion of the M1 interconnect layer, or in which a portion of the M1 interconnect layer is used to couple to the first capacitor plate 502. In other embodiments, one or more integrated capacitor structures may use a different interconnect layer, such as the M2 interconnect layer, to form one or more first capacitor plates. Of course, in a particular IC, a mix of different interconnect layers may be used for different integrated capacitor structures.

In some embodiments, a single first capacitor plate may be capacitively coupled to two or more second capacitor plates. In some embodiments, a single second capacitor plate may be capacitively coupled to two or more first capacitor plates.

A benefit of IC structures of the type shown in FIGS. 4A-4D and FIG. 5 is that the integrated capacitor structures are spaced away from the handle wafer 204, thus reducing parasitic capacitive coupling.

Another benefit of IC structures of the type shown in FIGS. 4A-4D and FIG. 5 is that the handle wafer 204 may be an inexpensive silicon wafer, and especially an inexpensive low resistivity silicon wafer (e.g., silicon wafers having a resistivity of about 14-200 ohms).

While the particular IC examples shown in FIGS. 4A-4D and FIG. 5 do not show a FET or CAS-gated FET, the integrated capacitor structures described above are compatible with FETs and/or CAS-gated FETs (as taught in co-pending U.S. patent application Ser. No. 15/920,321, entitled "Semiconductor-on-Insulator Transistor with Improved Breakdown Characteristics" and referenced above).

Embodiments of the present invention may include integrated circuit inductor structures of the type described in co-pending U.S. Patent Application entitled "High-Q Integrated Circuit Inductor Structure and Methods", referenced above.

Uses

Circuits and devices made using IC structures in accordance with the present invention may be used alone or in combination with other components, circuits, and devices. Integrated circuit embodiments of the present invention may be encased in IC packages and/or or modules for ease of handling, manufacture, and/or improved performance.

Circuits and devices made using IC structures in accordance with the present invention are useful in a wide variety of larger radio frequency (RF) circuits for performing a range of functions. Such functions are useful in a variety of applications, such as radar systems (including phased array and automotive radar systems), radio systems, and test equipment. Such circuits may be useful in systems operating over some or all of the RF range (e.g., from around 20 kHz to about 300 GHz).

Radio system usage includes cellular radios systems (including base stations, relay stations, and hand-held transceivers) that use such technology standards as various types of orthogonal frequency-division multiplexing ("ODFM"), various types of quadrature amplitude modulation ("QAM"), Code Division Multiple Access ("CDMA"), Wide Band Code Division Multiple Access ("WCDMA"), Global System for Mobile Communications ("GSM"), Enhanced Data Rates for GSM Evolution (EDGE), Long Term Evolution ("LTE"), 5G New Radio ("5G NR"), as well as other radio communication standards and protocols.

In particular, the present invention is useful in portable battery-operated devices, such as cellular telephones, that would benefit from RF circuitry having SLT ICs with integrated capacitors.

Methods

Figure 6:
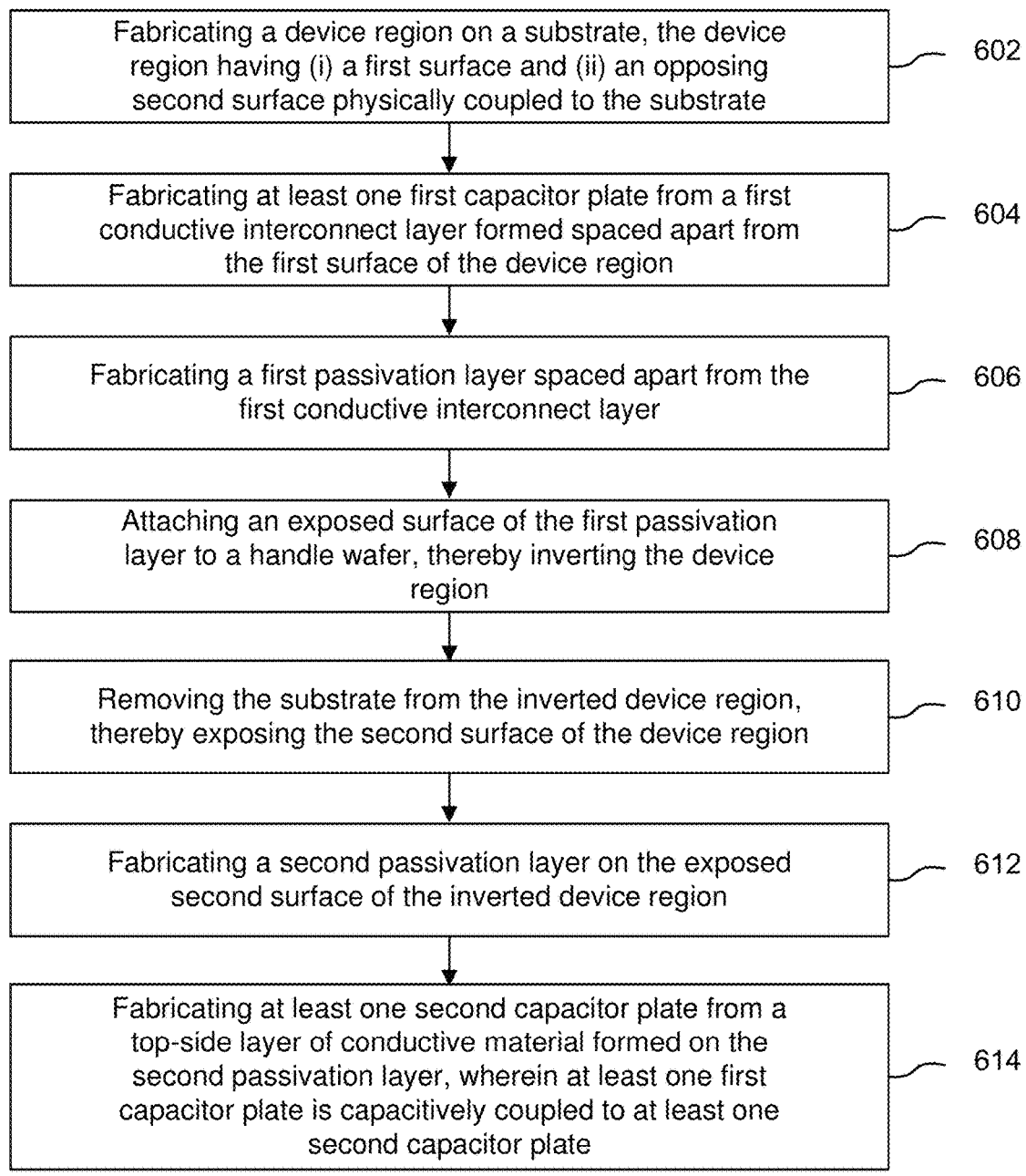
FIG. 6 is a process flow chart showing a first method of fabricating an integrated circuit structure with integrated capacitors.

Another aspect of the invention includes methods for fabricating SLT ICs with integrated capacitors. For example, FIG. 6 is a process flow chart 600 showing a first method of fabricating an integrated circuit structure with integrated capacitors, including: fabricating a device region on a substrate, the device region having (i) a first surface and (ii) an opposing second surface physically coupled to the substrate [Block 602]; fabricating at least one first capacitor plate from a first conductive interconnect layer formed spaced apart from the first surface of the device region [Block 604]; fabricating a first passivation layer spaced apart from the first conductive interconnect layer [Block 606]; attaching an exposed surface of the first passivation layer to a handle wafer, thereby inverting the device region [Block 608]; removing the substrate from the inverted device region, thereby exposing the second surface of the device region [Block 610]; fabricating a second passivation layer on the exposed second surface of the inverted device region [Block 612]; and fabricating at least one second capacitor plate from a top-side layer of conductive material formed on the second passivation layer, wherein at least one first capacitor plate is capacitively coupled to at least one second capacitor plate [Block 614].

Further aspects of the above method may include one or more of the following: fabricating an electrical connection between the top-side layer of conductive material and at least one first capacitor plate; fabricating an electrical connection between at least one first capacitor plate and a second conductive interconnect layer; fabricating an electrical connection between at least one second capacitor plate and a second conductive interconnect layer; at least one first capacitor plate being capacitively coupled to at least two second capacitor plates; at least one second capacitor plate being capacitively coupled to at least two first capacitor plates; fabricating at least one field effect transistor as part of the integrated circuit structure; fabricating at least one field effect transistor having a conductive aligned supplemental gate as part of the integrated circuit structure; fabricating the integrated circuit structure using a silicon-on-insulator process; the handle wafer being principally silicon; and/or the handle wafer including a low resistivity silicon wafer.

Figure 7:
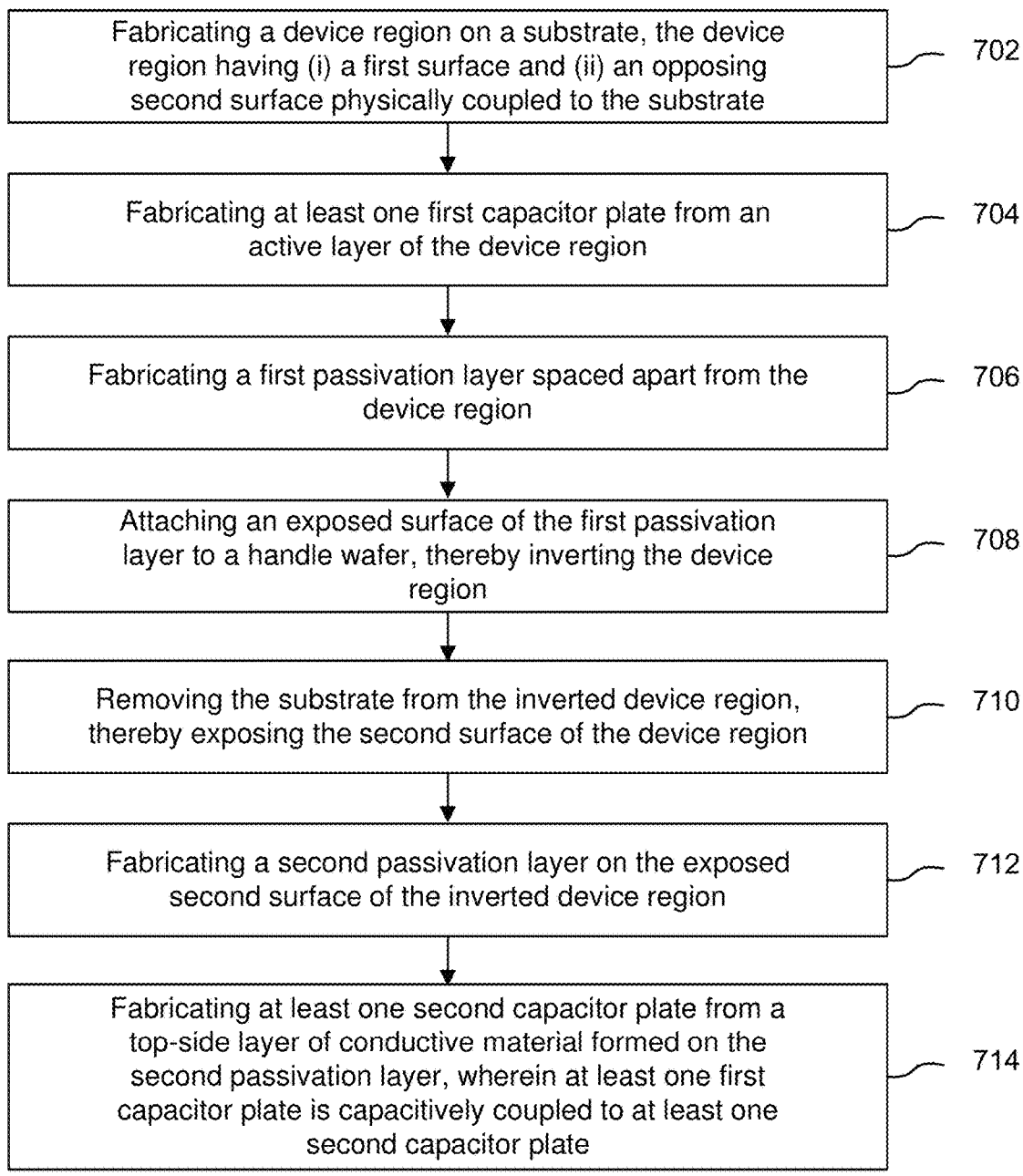
FIG. 7 is a process flow chart showing a second method of fabricating an integrated circuit structure with integrated capacitors.

As another example, FIG. 7 is a process flow chart 700 showing a second method of fabricating an integrated circuit structure with integrated capacitors, including: fabricating a device region on a substrate, the device region having (i) a first surface and (ii) an opposing second surface physically coupled to the substrate [Block 702]; fabricating at least one first capacitor plate from an active layer of the device region [Block 704]; fabricating a first passivation layer spaced apart from the device region [Block 706]; attaching an exposed surface of the first passivation layer to a handle wafer, thereby inverting the device region [Block 708]; removing the substrate from the inverted device region, thereby exposing the second surface of the device region [Block 710]; fabricating a second passivation layer on the exposed second surface of the inverted device region [Block 712]; and fabricating at least one second capacitor plate from a top-side layer of conductive material formed on the second passivation layer, wherein at least one first capacitor plate is capacitively coupled to at least one second capacitor plate [Block 714].

Further aspects of the above method may include one or more of the following: fabricating at least one lateral electrical connection from a first conductive interconnect layer before inverting the device region, and fabricating a conductive via between at least one lateral electrical connection and at least one first capacitor plate; fabricating an electrical connection between the top-side layer of conductive material and at least one lateral electrical connection; fabricating an electrical connection between at least one first capacitor plate and at least one second conductive interconnect layer; including fabricating an electrical connection between at least one second capacitor plate and at least one second conductive interconnect layer; at least one first capacitor plate being capacitively coupled to at least two second capacitor plates; at least one second capacitor plate being capacitively coupled to at least two first capacitor plates; fabricating at least one field effect transistor as part of the integrated circuit structure; fabricating at least one field effect transistor having a conductive aligned supplemental gate as part of the integrated circuit structure; fabricating the integrated circuit structure using a silicon-on-insulator process; wherein the handle wafer being principally silicon; and/or the handle wafer including a low resistivity silicon wafer.

Fabrication Technologies & Options

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Conclusion

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. An integrated circuit structure including:
   (a) a handle wafer having at least a first surface;
   (b) a first passivation layer having a first surface physically coupled to the first surface of the handle wafer, and having a second surface;
   (c) at least one first capacitor plate formed from a first conductive interconnect layer formed spaced apart from the second surface of the first passivation layer;
   (d) an inverted device region having a first surface formed spaced apart from the first conductive interconnect layer, and having a second surface;
   (e) a second passivation layer having a first surface physically coupled to the second surface of the inverted device region, and having a second surface; and
   (f) at least one second capacitor plate formed from a top-side layer of conductive material formed on the second surface of the second passivation layer;
   wherein at least one first capacitor plate is capacitively coupled to at least one second capacitor plate.

2. The invention of claim 1, further including:
   (a) a conductive via connected to the first capacitor plate; and
   (b) a lateral electrical connection in electrical contact with the conductive via and formed from a first conductive interconnect layer positioned between the first passivation layer and the inverted device region.

3. The invention of claim 2, further including an electrical connection formed between the top-side layer of conductive material and the lateral electrical connection.

4. The invention of claim 1, wherein at least one first capacitor plate is capacitively coupled to at least two second capacitor plates.

5. The invention of claim 1, wherein at least one second capacitor plate is capacitively coupled to at least two first capacitor plates.

6. The invention of claim 1, wherein the integrated circuit structure includes at least one field effect transistor.

7. The invention of claim 1, wherein the integrated circuit structure includes at least one field effect transistor having a conductive aligned supplemental gate.

8. The invention of claim 1, wherein the integrated circuit structure is fabricated using a silicon-on-insulator process.

9. The invention of claim 1, wherein the handle wafer is principally silicon.

10. The invention of claim 1, wherein the handle wafer is principally silicon, and the first surface includes a bonding layer of silicon dioxide.

11. The invention of claim 1, wherein the handle wafer includes a low resistivity silicon wafer.

12. An integrated circuit structure including:
   (a) a handle wafer having at least a first surface;
   (b) a first passivation layer having a first surface physically coupled to the first surface of the handle wafer, and having a second surface;
   (c) an inverted device region having a first surface formed spaced apart from the first passivation layer, and having a second surface;

(d) at least one first capacitor plate comprising an isolated portion of an active layer of the inverted device region;

(e) a second passivation layer having a first surface physically coupled to the second surface of the inverted device region, and having a second surface; and (f) at least one second capacitor plate formed from a top-side layer of conductive material formed on the second surface of the second passivation layer;

wherein at least one first capacitor plate is capacitively coupled to at least one second capacitor plate.

13. The invention of claim 6, further including:

(a) a conductive via connected to the first capacitor plate; and (b) a lateral electrical connection in electrical contact with the conductive via and formed from a first conductive interconnect layer positioned between the first passivation layer and the inverted device region.

14. The invention of claim 7, further including an electrical connection formed between the top-side layer of conductive material and the lateral electrical connection.

15. The invention of claim 6, wherein at least one first capacitor plate is capacitively coupled to at least two second capacitor plates.

16. The invention of claim 6, wherein at least one second capacitor plate is capacitively coupled to at least two first capacitor plates.

17. The invention of claim 6, wherein the integrated circuit structure includes at least one field effect transistor.

18. The invention of claim 6, wherein the integrated circuit structure includes at least one field effect transistor having a conductive aligned supplemental gate.

19. The invention of claim 6, wherein the integrated circuit structure is fabricated using a silicon-on-insulator process.

20. The invention of claim 6, wherein the handle wafer is principally silicon.

21. The invention of claim 6, wherein the handle wafer is principally silicon, and the first surface includes a bonding layer of silicon dioxide.

22. The invention of claim 6, wherein the handle wafer includes a low resistivity silicon wafer.

\* \* \* \* \*